United States Patent
Fujisawa (10) Patent No.: US 8,040,752 B2
(45) Date of Patent: Oct. 18, 2011

(54) COUNTER CIRCUIT, LATENCY COUNTER, SEMICONDUCTOR MEMORY DEVICE INCLUDING THE SAME, AND DATA PROCESSING SYSTEM

(75) Inventor: Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 260 days.

(21) Appl. No.: 12/467,657

(22) Filed: May 18, 2009

(65) Prior Publication Data

US 2009/0285048 A1  Nov. 19, 2009

(30) Foreign Application Priority Data

May 16, 2008  (JP) .................................. 2008-129087

(51) Int. Cl.
*G11C 8/00* (2006.01)
(52) U.S. Cl. .................................... 365/233.1; 365/236
(58) Field of Classification Search .............. 365/233.1, 365/236, 194, 189.14
See application file for complete search history.

(56) References Cited

U.S. PATENT DOCUMENTS

| 6,388,945 B2 * | 5/2002 | Aikawa ..................... 365/233.11 |
| 7,345,950 B2 | 3/2008 | Fujisawa et al. |
| 2008/0043566 A1 | 2/2008 | Fujisawa |
| 2008/0192563 A1 * | 8/2008 | Cho ......................... 365/233.17 |
| 2009/0323441 A1 * | 12/2009 | Johnson et al. ........... 365/189.16 |

FOREIGN PATENT DOCUMENTS

| JP | 2007-115351 A | 5/2007 |
| JP | 2008-047267 A | 2/2008 |

* cited by examiner

*Primary Examiner* — Vu Le
(74) *Attorney, Agent, or Firm* — Sughrue Mion, PLLC (57) ABSTRACT

To provide a counter circuit capable of accurately counting a high-frequency signal in which hazard or the like is easily generated. There are provided: a frequency dividing circuit that generates first and second frequency dividing clocks, which differ in phase to each other, based on a clock signal; a first counter that counts the first frequency dividing clock; a second counter that synchronizes with the second frequency dividing clock to fetch a count value of the first counter; and a selection circuit that exclusively selects count values of the first and second counters. According to the present invention, a relation of the count values between the first and second counters is kept always constant, and thus, even when hazard occurs, the count values are only made to jump and the count values do not fluctuate.

16 Claims, 10 Drawing Sheets

COUNTER CIRCUIT, LATENCY COUNTER, SEMICONDUCTOR MEMORY DEVICE INCLUDING THE SAME, AND DATA PROCESSING SYSTEM

BACKGROUND OF THE INVENTION

1. Field of the Invention

The present invention relates to a counter circuit, and, more particularly relates to a counter circuit that can suitably count a clock signal in which hazard easily occurs. Furthermore, the present invention relates to a latency counter, and, more particularly relates to a latency counter that counts a latency of an internal command within a synchronous memory. Further, the present invention relates to a semiconductor memory device including such a latency counter and also relates to a data processing system including such a semiconductor memory device.

2. Description of Related Art

Synchronous memories represented by a synchronous DRAM (Synchronous Dynamic Random Access Memory) are widely used as a main memory or the like of personal computers. In the synchronous memory, data is inputted and outputted in synchronism with a clock signal supplied from a controller. Thus, when a higher-speed clock is used, the data transfer rate can be increased.

However, because a DRAM core is consistently operated by an analog operation also in the synchronous DRAM, a considerably weak charge needs to be amplified by a sensing operation. Accordingly, it is not possible to shorten the time from issuing a read command to outputting first data. After the elapse of a predetermined delay time from the read command is issued, the first data is outputted in synchronism with an external clock.

This delay time is generally called "CAS latency" and is set to an integral multiple of a clock cycle. For example, when the CAS latency is 5 (CL=5), the read command is fetched in synchronism with the external clock, and thereafter, the first data is outputted in synchronism with the external clock that is after five cycles. That is, the first data is outputted after the elapse of the five clocks. A counter that counts such latency is called "latency counter".

As the latency counter, a circuit described in Japanese Patent Application Laid-open (JP-A) No. 2008-47267 proposed by the present inventor(s) is well known. The latency counter described in JP-A No. 2008-47267 includes a ripple counter that outputs a count value in a binary format and a point-shift FIFO circuit, in which by a count value of the ripple counter, an input gate and an output gate of the point-shift FIFO circuit are controlled. The reason for using the ripple counter as the counter circuit is due to a consideration of a point that hazard easily occurs in a clock signal that should be counted.

That is, in the general DRAM, a DLL (Delay Locked Loop) circuit is used, and data is inputted and outputted in synchronism with an output clock generated by the DLL circuit. The DLL circuit always operates in a normal mode; however, when it is entered in a power-down mode or the like, its operation is stopped due to reduction of power consumption. Thus, upon returning from the power-down mode to the normal mode, a state that the output clock is temporarily unstable occurs, and hazard is sometimes outputted.

When hazard occurs in the output clock, if a ring counter in which shift registers are circulation-connected is used, for example, the count value sometimes fluctuates. That is, in the ring counter, it is necessary that the number of registers to which an active level is latched is one. However, there is sometimes a state that the active level is latched to two or more registers by hazard, or the active level is not latched to any register. When the ring counter is in such a state, the count value fluctuates and the operation of the latency counter is disabled.

Such problems can be solved by using a ripple counter in which a counting operation is performed in a binary format. That is, the ripple counter is deemed not to experience a state that the count value fluctuates, and thus, even when the count value is made to jump wrongly by hazard, the count value can be used as is. Due to these reasons, in the latency counter in JP-A No. 2008-47267, the ripple counter is used as the counter circuit.

Japanese Patent Application Laid-open No. 2007-115351 discloses a similar circuit, as another patent document related to the latency counter.

As described above, as a countermeasure against hazard, it is very effective to use the ripple counter as the counter circuit used for the latency counter. However, in the ripple counter, a count value changes more belatedly in higher-order bits. Thus, when the frequency of the clock signal is very high, there can be a case that the output of the count value is not in time for the operation of the FIFO circuit, depending upon a certain situation.

Such a problem occurs not only in the counter circuit for a latency counter but also in overall counter circuits that need to count a high-frequency signal in which hazard or the like is easily generated.

SUMMARY

The present invention seeks to solve one or more of the above problems, or to improve upon those problems at least in part.

In one embodiment, there is provided a counter circuit that includes: a frequency dividing circuit that generates, based on a clock signal, a plurality of frequency dividing clocks that are composed of at least first and second frequency dividing clocks, which differ in phase to each other; a first counter that counts the first frequency dividing clock; a second counter that fetches a count value of the first counter in synchronism with the second frequency dividing clock; and a selection circuit that exclusively selects count values of the first and second counters.

While the type of the first counter is not particularly limited, it is preferable to use a counter, e.g., a ripple counter, which outputs a count value in a binary format. When a ripple counter is used, there is a problem that higher-order bits change more belatedly at a time of incrementing or decrementing. However, in the present invention, a counting operation is performed based on a frequency dividing clock obtained by frequency-dividing the clock signal, not on the clock signal itself. Thus, it becomes possible to sufficiently compensate the delay of change of high-order bits.

Further, the second counter generates a count value by fetching the count value of the first counter, and thus a relation between the count value of the first counter and that of the second counter can be kept always constant. That is, even when the count value of the first counter is made to jump by hazard or the like, the count value of the second counter is also made to jump in cooperation therewith. Thus, when the count values of the first and second counters are exclusively selected by a selection circuit, outputting of an accurate count value all the time can be made.

In another embodiment, there is provided a latency counter that counts a latency of an internal command in synchronism with the clock signal, the latency counter that includes: the counter circuit as claimed in claim 1; and a point-shift FIFO circuit including a plurality of latch circuits, wherein the point-shift FIFO circuit fetches the internal command to any one of the latch circuits based on a count value of the counter circuit, and outputs the internal command fetched to any one of the latch circuits based on a count value of the counter circuit.

Accordingly, even when the frequency of the clock signal is high and hazard or the like easily occur, accurately counting of the latency of the internal command can be made.

In still another embodiment, there is provided a semiconductor memory device that includes the latency counter as described above. Further, in another embodiment, there is provided a data processing system wherein the semiconductor memory device and a data processor are connected to each other by a system bus.

As described above, according to the present invention, a counting operation is performed based on a frequency dividing clock obtained by frequency-dividing the internal clock, not on an internal clock itself. Thus, even when the frequency of the clock is high, it becomes possible to sufficiently secure an operation margin.

Further, a second counter generates a count value by fetching the count value of the first counter, and thus a relation between the count value of the first counter and that of the second counter can be kept always constant. Accordingly, even when the count value of the first counter is made to jump, an accurate count value can be outputted all the time.

Accordingly, when the counter circuit according to the present invention is used for a latency counter, even when the frequency of the clock signal is high and hazard or the like easily occur, it becomes possible to accurately count the latency of the internal command.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
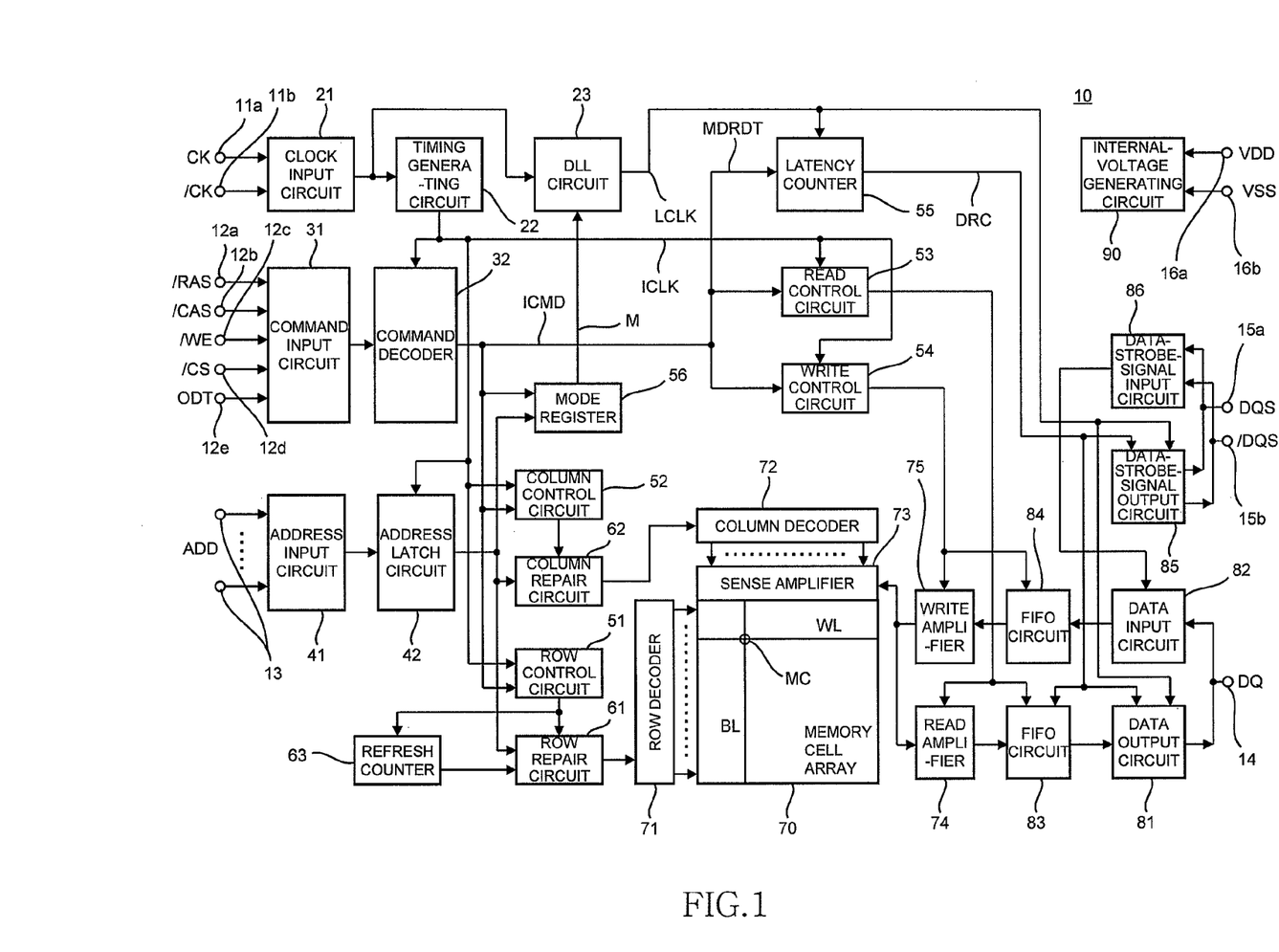
FIG. 1 is a block diagram showing an entire configuration of a semiconductor memory device 10 according to a preferred embodiment of the present invention.

FIG. 1 is a block diagram showing an entire configuration of a semiconductor memory device 10 according to an embodiment of the present invention.

The semiconductor memory device 10 is a synchronous DRAM, and includes as external terminals such as: clock terminals 11a and 11b; command terminals 12a to 12e; an address terminal 13; a data input/output terminal 14; data strobe terminals 15a and 15b; and power supply terminals 16a and 16b.

The clock terminals 11a and 11b are supplied with clock signals CK and /CK, respectively, and the supplied clock signals CK and /CK are supplied to a clock input circuit 21. In this specification, a signal assigned with "/" at the head of a signal name means an inverted signal of the corresponding signal. Accordingly, the clock signals CK and /CK are mutually complementary signals. Output of the clock input circuit 21 is supplied to a timing generating circuit 22 and a DLL circuit 23. The timing generating circuit 22 generates an internal clock ICLK, and serves a roll for supplying the clock to each of various types of internal circuits other than circuits of a data output system. The DLL circuit 23 generates an output clock LCLK, and serves a roll for supplying the clock to circuits of a data output system.

The output clock LCLK generated by the DLL circuit 23 is a signal phase-controlled for the clock signals CK and /CK, and is slightly advanced in phase for the clock signals CK and /CK so that phases of read data DQ (and data strobe signals DQS and /DQS) match those of the clock signals CK and /CK.

Whether possible to use the DLL circuit 23 is selected according to a set content to a mode register 56. That is, when a "DLL-on mode" is set to the mode register 56, the DLL circuit 23 is in a usable state, and the output clock LCLK is phase-controlled for the clock signals CK and /CK. On the other hand, when a "DLL-off mode" is set to the mode register 56, the DLL circuit 23 is in a non-usable state, and the output clock LCLK is not phase-controlled for the clock signals CK and /CK any more. Accordingly, at the time of the DLL-off mode, the output clock LCLK is a signal of which the phase is delayed more with respect to the clock signal CK. Control of the DLL circuit 23 by the mode register 56 is performed by a mode signal M.

The command terminals 12a to 12e are supplied with a row address strobe signal /RAS, a column address strobe signal /CAS, a write enable signal /WE, a chip select signal /CS, and an on-die-termination signal ODT, respectively. These command signals are supplied to a command input circuit 31. The command signals supplied to the command input circuit 31 are supplied to a command decoder 32. The command decoder 32 generates various types of internal commands ICMD by retaining, decoding, counting, and so on the command signals in synchronism with the internal clock ICLK. The generated internal commands are supplied to a row control circuit 51, a column control circuit 52, a read control circuit 53, a write control circuit 54, a latency counter 55, and the mode register 56. Among the various types of internal commands ICMD, the read command MDRDT is supplied at least to the latency counter 55.

The latency counter 55 delays the read command MDRDT so that the read data is outputted after the elapse of a previously set CAS latency from a time that the read command MDRDT is issued. Whereas the read command MDRDT is a signal synchronous with the internal clock ICLK, an output control signal DRC that is output of the latency counter 55 needs to be in synchronism with the output clock LCLK. Accordingly, the latency counter 55 also serves a role for shifting the clock that is a synchronization target, from the internal clock ICLK to the output clock LCLK. The latency counter 55 will be described in detail later.

The address terminal 13 is supplied with an address signal ADD, and the supplied address signal ADD is supplied to an address input circuit 41. Output of the address input circuit 41 is supplied to an address latch circuit 42. The address latch circuit 42 latches the address signal ADD in synchronism with the internal clock ICLK. Out of the address signal ADD latched to the address latch circuit 42, a row address is supplied to a row repair circuit 61 and a column address is supplied to a column repair circuit 62. The row repair circuit 61 is also supplied with a row address generated by a refresh counter 63. Upon entering a mode register set, the address signal ADD is supplied to the mode register 56.

The row repair circuit 61 repairs a row address by alternatively accessing a redundancy word line rather than a word line that should be normally accessed when the row address indicating a defective word line is supplied. The operation of the row repair circuit 61 is controlled by the row control circuit 51, and the output is supplied to a row decoder 71. The row decoder 71 selects any one of word lines WL included in a memory cell array 70. As shown in FIG. 1, in the memory cell array 70, a plurality of word lines WL and a plurality of bit lines BL cross, and memory cells MC are placed at the intersections. Each bit line BL is connected to the corresponding sense amplifier 73.

The column repair circuit 62 repairs a column address by alternatively accessing a redundancy bit line rather than a bit line that should be normally accessed when the column address indicating a defective bit line is supplied. The operation of the column repair circuit 62 is controlled by the column control circuit 52, and the output is supplied to a column decoder 72. The column decoder 72 selects any one of sense amplifiers 73 included in the memory cell array 70.

The sense amplifier 73 selected by the column decoder 72 is connected to a read amplifier 74 at the time of a read operation and connected to a write amplifier 75 at the time of a write operation. The operation of the read amplifier 74 is controlled by the read control circuit 53, and the operation of the write amplifier 75 is controlled by the write control circuit 54.

The data input/output terminal 14 outputs read data DQ and inputs write data DQ, and is connected to a data output circuit 81 and a data input circuit 82. The data output circuit 81 is connected to the read amplifier 74 via a FIFO circuit 83, and thereby, a plurality of prefetched read data DQ are burst-outputted from the data input/output terminal 14. The data input circuit 82 is connected to the write amplifier 75 via a FIFO circuit 84, and thereby, a plurality of write data DQ burst-inputted from the data input/output terminal 14 is simultaneously written in the memory cell array 70.

The data strobe terminals 15a and 15b input and output the data strobe signals DQS and /DQS, and are connected to a data-strobe-signal output circuit 85 and a data-strobe-signal input circuit 86, respectively.

As shown in FIG. 1, the data output circuit 81 and the data-strobe-signal output circuit 85 are supplied with an output clock LCLK generated by the DLL circuit 23 and an output control signal DRC generated by the latency counter 55. The output control signal DRC is also supplied to the FIFO circuit 83.

The power supply terminals 16a and 16b are supplied with power supply potentials VDD and VSS, respectively, and connected to an internal-voltage generating circuit 90. The internal-voltage generating circuit 90 generates various types of internal voltages.

The entire configuration of the semiconductor memory device 10 is as described above. The latency counter 55 included in the semiconductor memory device 10 is described next.

Figure 2:
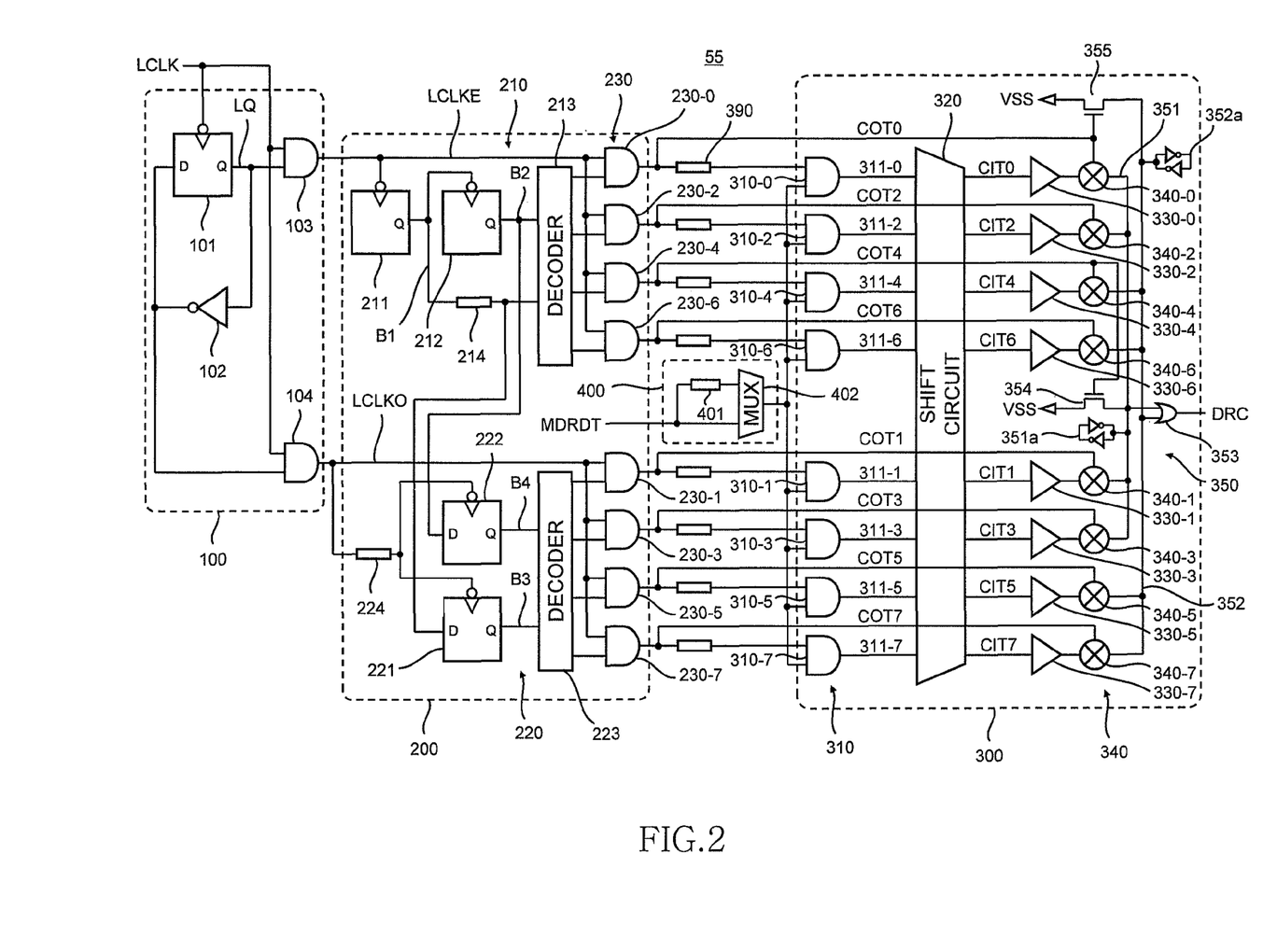
FIG. 2 is a circuit diagram of the latency counter 55 according to the preferred embodiment of the present invention.

FIG. 2 is a circuit diagram of the latency counter 55 according to the present embodiment.

As shown in FIG. 2, the latency counter 55 includes: a frequency dividing circuit 100 that generates frequency dividing clocks LCLKE and LCLKO based on the output clock LCLK; a counter circuit 200 that performs a counting operation based on the frequency dividing clocks LCLKE and LCLKO; and a point-shift FIFO circuit 300 that uses count values of the counter circuit 200 to count the latency of the read command MDRDT. When a component is merely called "counter circuit" in the specification, this can mean both the frequency dividing circuit 100 and the counter circuit 200.

The output clock LCLK is generated by the DLL circuit 23 shown in FIG. 1. At the time of self-refresh or power-down, the operation of the DLL circuit 23 is stopped to reduce the power consumption. Accordingly, upon returning from the self-refresh mode or power-down mode, the operation of the DLL circuit 23 is resumed, and at this time, the output clock LCLK is temporarily in an unstable state. During this state, hazard can be outputted.

Such hazard generally results in an erroneous operation of the latency counter. However, in the latency counter 55, even when hazard occurs in the output clock LCLK, the count values are only made to jump, and thus the count values do not fluctuate and a counting operating is not stopped.

The configuration and the operation of each circuit block configuring the latency counter 55 are described below.

The frequency dividing circuit 100 is described first.

As shown in FIG. 2, the frequency dividing circuit 100 includes: a latch circuit 101 that performs a latch operation in synchronism with a falling edge of the output clock LCLK; an inverter 102 that inverts a frequency dividing signal LQ outputted from an output terminal Q of the latch circuit 101 to supply it to an input terminal D; an AND circuit 103 that ANDs the output clock LCLK and the frequency dividing signal LQ; and an AND circuit 104 that ANDs inverted signals of the output clock LCLK and the frequency dividing signal LQ.

Figure 3:
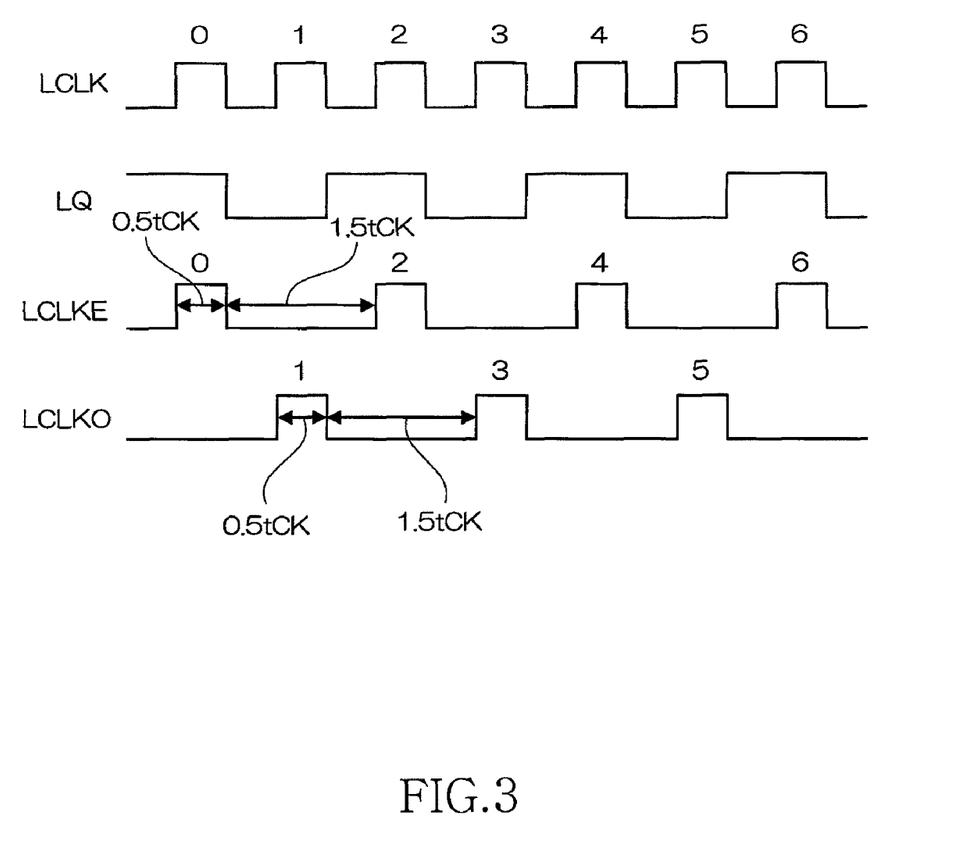
FIG. 3 is a timing chart for explaining an operation of a frequency dividing circuit 100.

With such a circuit configuration, as shown in FIG. 3, the frequency dividing clock LCLKE or output of the AND circuit 103 becomes a waveform in sequence with an even-numbered internal clock LCLK, and the frequency dividing clock LCLKO or output of the AND circuit 104 becomes a waveform in sequence with an odd-numbered internal clock LCLK. Thus, in the frequency dividing clocks LCLKE and LCLKO, an active period (a period during which a high level is attained) is 0.5 tCK and an inactive period (a period during which a low level is attained) is 1.5 tCK.

Thus, the frequency dividing circuit frequency-divides the output clock LCLK by two, thereby generating the two frequency dividing clocks LCLKE and LCLKO of which the phases differ from each other. The generated frequency dividing clocks LCLKE and LCLKO are supplied to the counter circuit 200, as shown in FIG. 2. This results in the counter circuit 200 to operate at a frequency half of the output clock LCLK.

The counter circuit 200 is described next.

As shown in FIG. 2, the counter circuit 200 includes: a first counter 210 that counts the frequency dividing clock LCLKE; a second counter 220 that synchronizes with the frequency dividing clock LCLKO to fetch the count values of the first counter 210; and a selection circuit 230 that exclusively selects the count values of the first and second counters 210 and 220.

As shown in FIG. 2, the first counter 210 includes: a 2-bit ripple counter in which ripple flip-flops 211 and 212 are connected in cascade; and a decoder 213 that decodes output of the ripple counter. A clock terminal of the flip-flop 211 is supplied with the frequency dividing clock LCLKE. Accordingly, an output bit B1 of the flip-flop 211 shows the least significant bit of a binary signal. An output bit B2 of the flip-flop 212 is the most significant bit of the binary signal.

The output bits B1 and B2 of the flip-flops 211 and 212 are supplied to the decoder 213. However, the output bits B1 and B2 do not change simultaneously, but the change starts from a lower-order bit. That is, a higher-order bit changes belatedly. In the present embodiment, to eliminate a difference in such change timings, a delay circuit 214 is used. The delay circuit 214 has a delay amount equivalent to one stage of the flip-flop. As shown in FIG. 2, the delay circuit 214 is connected between the flip-flop 211 and the decoder 213. Thus, the output bit B1 of the flip-flop 211 is applied a delay of one stage of the flip-flop, and thereafter, inputted to the decoder 213.

As a result, the change timings of the bits B1 and B2 inputted to the decoder 213 substantially match with each other. The decoder 213 activates any one of four (=$2^2$) outputs to a high level based on the bits B1 and B2 that are in a binary format.

The output of the decoder 213 changes in arrear of the frequency dividing clock LCLKE due to the presence of the flip-flops 211 and 212 or the delay circuit 214. However, in the present embodiment, the first counter 210 is the ripple counter of only two bits, and the delay amount is very small. Thus, a skew between the output of the decoder 213 and the frequency dividing clock LCLKE is hardly a problem.

On the other hand, the second counter 220 includes data-latch flip-flops 221 and 222, and a decoder 223 that decodes outputs of the flip-flops 221 and 222. Clock terminals of the flip-flops 221 and 222 are supplied with the frequency dividing clock LCLKO delayed by a delay circuit 224. A data input terminal D of the flip-flop 221 is supplied with the output bit B1 of the flip-flop 211, and a data input terminal D of the flip-flop 222 is supplied with the output bit B2 of the flip-flop 212. According to such a configuration, the second counter 220 can fetch the count values of the first counter 210 in synchronism with the frequency dividing clock LCLKO. That is, when the frequency dividing clock LCLKO is activated, the count values of the second counter 220 match the count values of the first counter 210.

Output bits B3 and B4 of the flip-flops 221 and 222 are supplied to the decoder 223. The output bits B3 and B4 change simultaneously, and thus a delay circuit or the like is not inserted in signal paths of the output bits B3 and B4. However, as described above, the first counter 210 is a ripple counter, and thus, when the generated output bits B1 and B2 change, a delay of a total of two stages of the flip-flop occurs. To correctly latch the output bits B1 and B2 having such a delay, the delay circuit 224 is arranged in the second counter 220. The delay circuit 224 has a delay amount equivalent to two stages of the flip-flop. As shown in FIG. 2, the delay circuit 224 is inserted in the signal path of the frequency dividing clock LCLKO.

As a result, the change timings of the output bits B3 and B4 inputted to the decoder 223 substantially match those of the output bits B5 and B2. The decoder 223 activates any one of four (=$2^2$) outputs to a high level based on the bits B3 and B4 that are in a binary format.

The selection circuit 230 is configured by: four AND circuits 230-0, 230-2, 230-4, and 230-6 corresponding to the outputs of the first counter 210; and four AND circuits 230-1, 230-3, 230-5, and 230-7 corresponding to the outputs of the second counter 220. One input terminals of the AND circuits 230-0, 230-2, 230-4, and 230-6 are supplied with the corresponding output bits of the first counter 210, respectively, and the other input terminals are supplied commonly with the frequency dividing clock LCLKE. One input terminals of the AND circuits 230-1, 230-3, 230-5, and 230-7 are supplied with the corresponding output bits of the second counter 220, respectively, and the other input terminals are supplied commonly with the frequency dividing clock LCLKO.

According to such a configuration, the output of the first counter 210 and the output of the second counter 220 are alternately selected, and the selected count values are supplied to the point-shift FIFO circuit 300. The count values of the counter circuit 200 are used as output-gate control signals COT0 to COT7.

Figure 4:
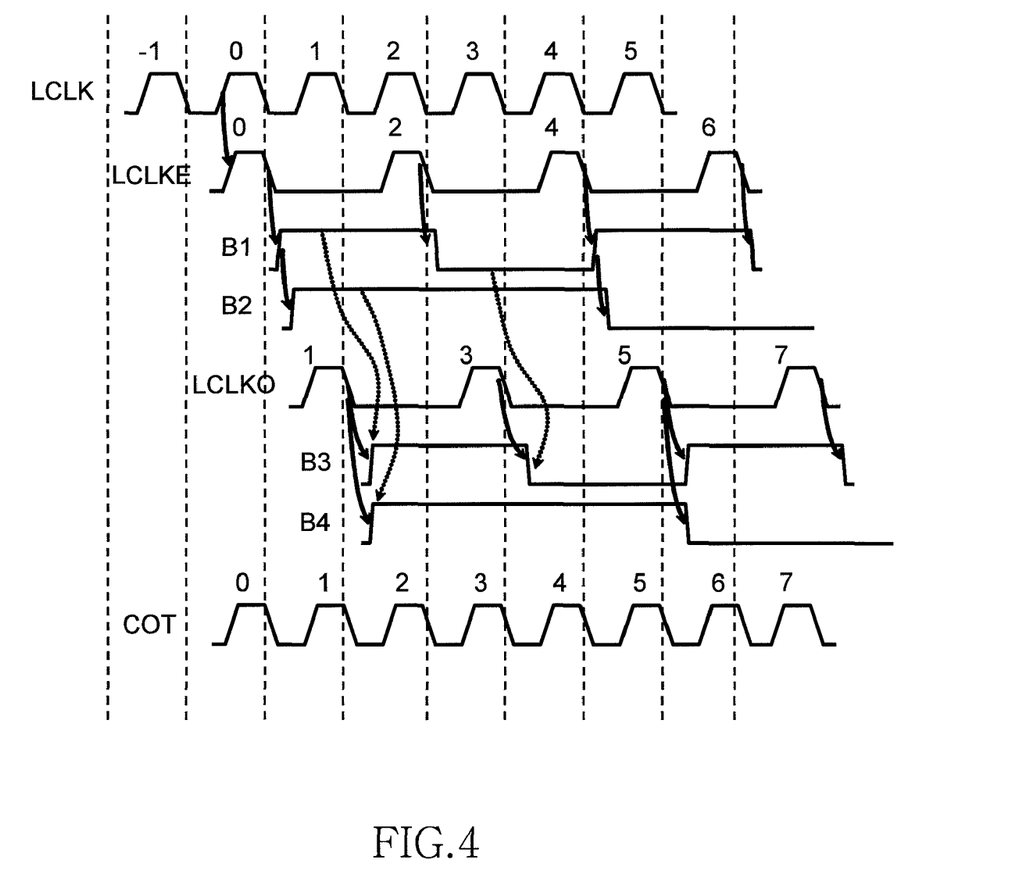
FIG. 4 is a timing chart for explaining an operation of a counter circuit 200.

FIG. 4 is a timing chart for describing the operation of the counter circuit 200.

As shown in FIG. 4, the output bits B1 and B2 that are the count values of the first counter 210 are incremented in synchronism with the frequency dividing clock LCLKE, and the output bits B3 and B4 that are the count values of the second counter 220 are incremented in synchronism with the frequency dividing clock LCLKO. This does not mean that the increment operations are performed without regard to each other. Instead, the count values of the first counter 210 are fetched as the count values of the second counter 220, and thus the count values of the second counter 220 follow those of the first counter 210. Accordingly, when the count values of the first counter 210 are made to jump by hazard or the like, the count values of the second counter 220 are also made to jump to the same values. In this way, the count values of the first counter 210 and those of the second counter 220 are incremented always in a correlated state.

The generated count values are selected by the selection circuit 230. That is, in a period during which the frequency dividing clock LCLKE is at high level, the count values of the first counter 210 are selected, and in a period during which the frequency dividing clock LCLKO is at high level, the count values of the second counter 220 are selected. As a result, the count values of the counter circuit 200 are incremented in synchronism with the output clock LCLK. That is, the output-gate control signals COT0 to COT7 are activated in this order.

Further, when the count values of the first counter 210 are made to jump by hazard or the like, the activated output-gate control signals COT0 to COT7 change in an unpredicted manner. However, the first and second counters 210 and 220 output the count values in a binary format. Thus, this eliminates a possibility of an indefinite state such as: a plurality of output-gate control signals COT0 to COT7 are simultaneously activated, or neither output-gate control signals COT0 to COT7 are activated. That is, the count values are only made to jump. Further, hazard occurs only at the time of returning from the power-down mode or the like, and thus, in the point-shift FIFO circuit 300 described later, the read command MDRDT is not accumulated.

Accordingly, even when the count values are made to jump by hazard or the like, the counter circuit 200 is automatically recovered, and can operate normally immediately thereafter. This is because when the point-shift FIFO circuit 300 starts an operation, the count values themselves of the counter circuit 200 are irrelevant, and if the count values sequentially change, an accurate operation can be performed.

The point-shift FIFO circuit 300 is described next.

As shown in FIG. 2, the point-shift FIFO circuit 300 includes an input selection circuit 310, a shift circuit 320, latch circuits 330-0 to 330-7, an output selection circuit 340, and a combining circuit 350.

The input selection circuit 310 is configured by eight AND circuits 310-0 to 310-7. In the AND circuits 310-0 to 310-7, one input terminals are commonly inputted the read command MDRDT, and the other input terminals are inputted the output-gate control signals COT0 to COT7, respectively, delayed by the delay circuit 390.

Thereby, when the read command MDRDT is activated, based on the count values of the counter circuit 200, the read command MDRDT is supplied to any one of the signal paths 311-0 to 311-7. For example, when is supplied at the timing at which the output-gate control signal COT0 is activated, only the signal path 311-0 is supplied with the read command MDRDT, and the other signal paths 311-1 to 311-7 are not supplied with the read command MDRDT. In this case, the signal paths 311-0 to 311-7 are supplied with output signals of the AND circuits 310-0 to 310-7, respectively.

The signal paths 311-0 to 311-7 are connected to the input terminals of the shift circuit 320. The shift circuit 320 supplies the read command MDRDT to a predetermined latch circuit based on a previously-determined corresponding relation between the signal paths 311-0 to 311-7 and the latch circuits 330-0 to 330-7.

Figure 5:
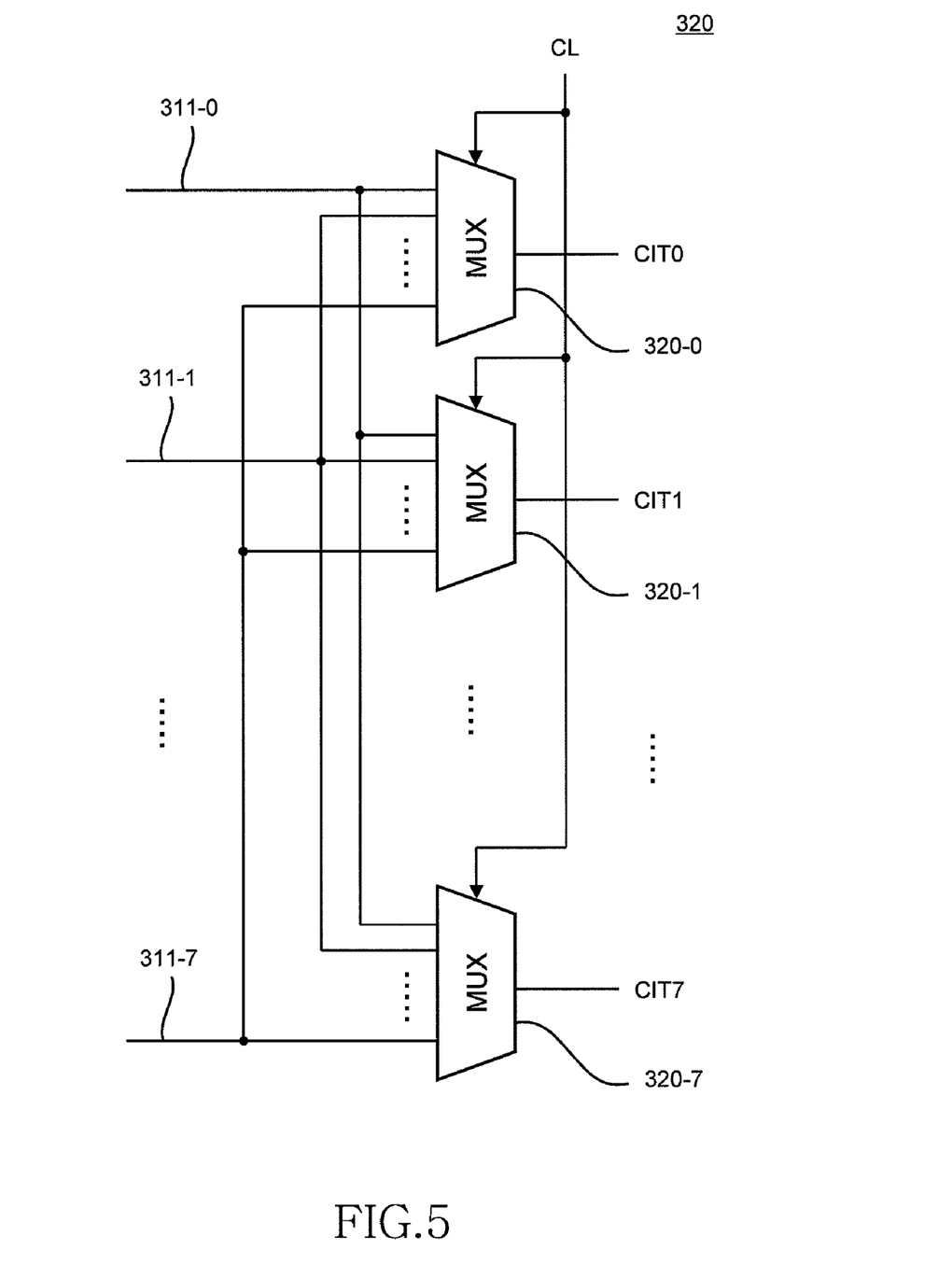
FIG. 5 is a circuit diagram of a shift circuit 320

FIG. 5 is a circuit diagram of the shift circuit 320.

As shown in FIG. 5, the shift circuit 320 is configured by eight multiplexers 320-0 to 320-7. The multiplexers 320-0 to 320-7 are all connected to the signal paths 311-0 to 311-7, and when the read command MDRDT is supplied onto the previously determined signal paths 311-0 to 311-7, input-gate control signals CIT0 to CIT7 as outputs are activated to a high level.

Whether the input-gate control signals CIT0 to CIT7 are set to a high level when the read command MDRDT is supplied on which of the signal paths 311-0 to 311-7 totally differs depending on the multiplexers 320-0 to 320-7. The designation is performed by a latency setting signal CL.

Figure 6A:
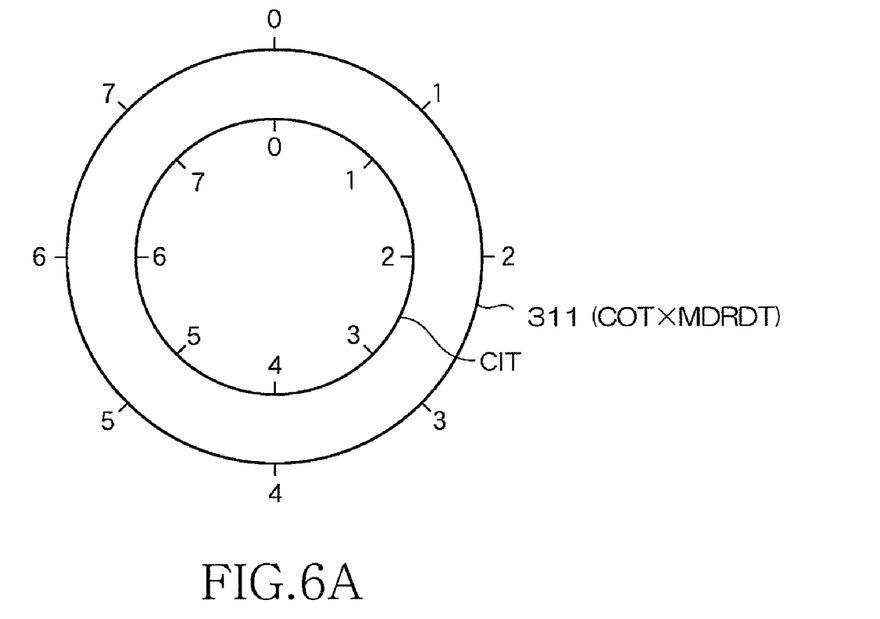
FIGS. 6A and 6B are pattern diagrams for explaining a function of the shift circuit 320.
Figure 6B:
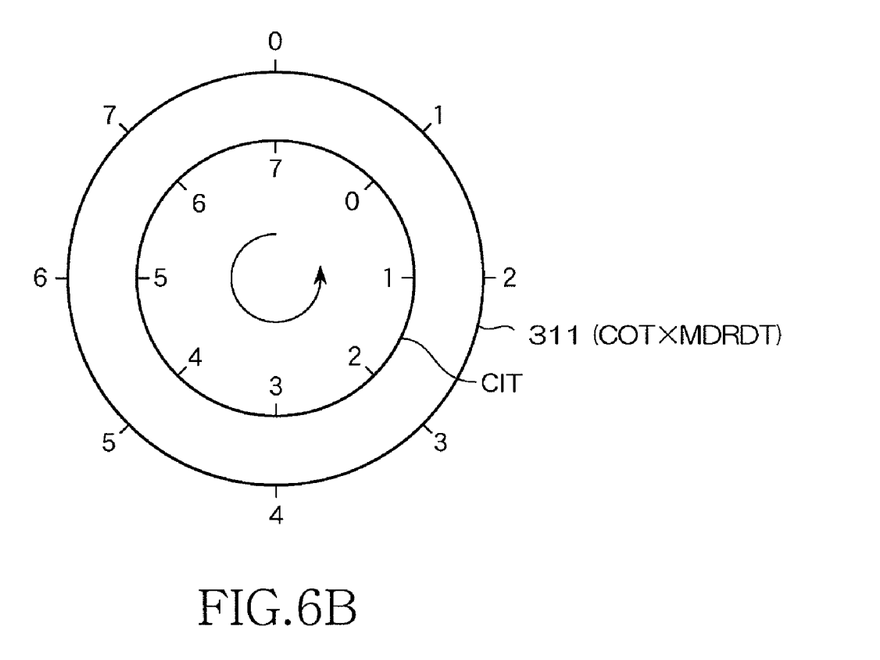

FIGS. 6A and 6B are schematic diagrams each for explaining a function of the shift circuit 320.

An outer ring 311 shown in FIG. 6 indicates the signal paths 311-0 to 311-7, and an inner ring CIT indicates the input-gate control signals CIT0 to CIT7. The outer ring 311 can be regarded as an AND operation between the output-gate control signals COT0 to COT7 and the read command MDRDT. The signal and the signal path that are matched with the scales assigned to the rings 311 and CIT mean the corresponding signal and signal path.

More specifically, FIG. 6A shows an example in which a difference between the signal paths 311-0 to 311-7 and the input-gate control signals CIT0 to CIT7 is set to "0". In this case, when the read command MDRDT is supplied to the signal path 311-0, the input-gate control signal CIT0 corresponding thereto becomes high level, and when the read command MDRDT is supplied to the signal path 311-2, the input-gate control signal CIT2 corresponding thereto becomes high level. That is, provided that a signal path 311-k (k=0 to 7) and an input-gate control signal CITj (j=0 to 7) correspond to each other, a state of j=k is established.

On the other hand, FIG. 6B shows an example in which a difference between the signal paths 311-0 to 311-7 and the input-gate control signals CIT0 to CIT7 is set to "7". This is an image obtained by turning the inner ring CIT by seven scales in the left. In this case, when the read command MDRDT is supplied to the signal path 311-0, the input-gate control signal CIT7 corresponding thereto becomes high level, and when the read command MDRDT is supplied to the signal path 311-3, the input-gate control signal CIT2 corresponding thereto becomes high level. That is, a state of j−k=7 or j−k=−1 is established.

The difference can be set to any one of 0 to 7, and in a set state, the corresponding relation between the signal path and the input-gate control signal is fixed. In this way, the shift circuit 320 shifts the read command MDRDT on the signal path 311-0 to 311-7, and generates the input-gate control signal CIT0 to CIT7. Such a difference is determined based on a required CAS latency.

Thus, in the present embodiment, the input selection circuit 310 is placed at a preceding stage of the shift circuit 320, and thus, when the read command MDRDT is activated, only one of the multiplexers 320-0 to 320-7 is operated. Thus, as compared to a case that all the multiplexers are operated irrespective of the presence of the activation of the read command MDRDT, the power consumption can be further reduced.

The input-gate control signals CIT0 to CIT7 generated by the shift circuit 320 are supplied to the latch circuits 330-0 to 330-7, respectively. At a succeeding stage of the latch circuits 330-0 to 330-7, output gates 340-0 to 340-7 configuring the output selection circuit 340 are connected, respectively.

Figure 7:
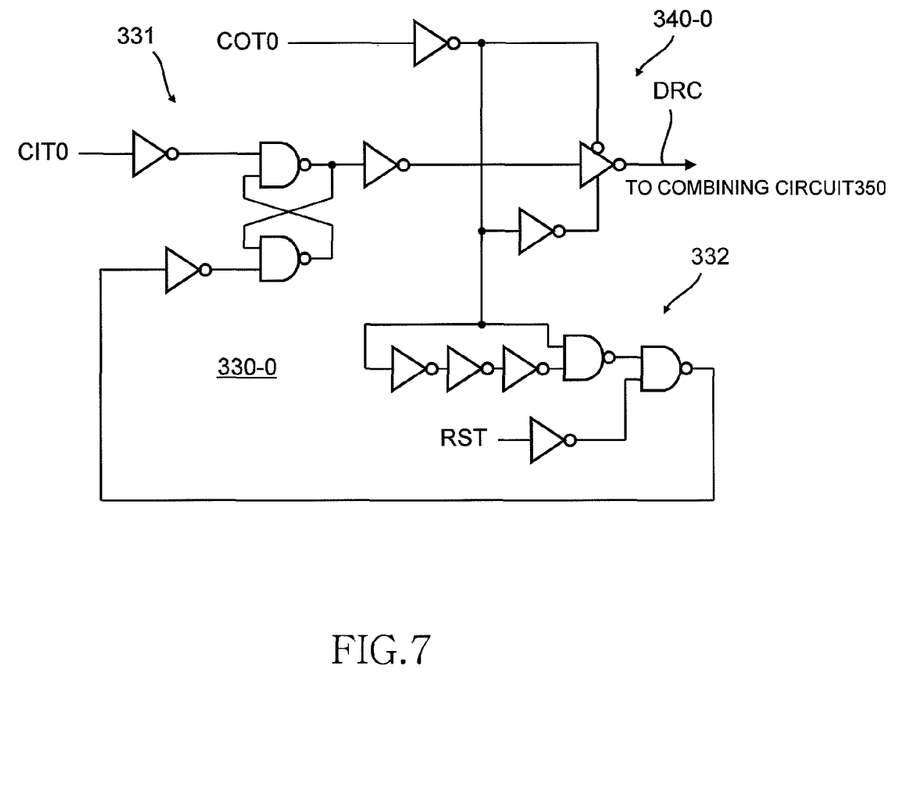
FIG. 7 is a circuit diagram of a latch circuit 330-0 and an output gate 340-0.

FIG. 7 is a circuit diagram of the latch circuit 330-0 and the output gate 340-0. The other latch circuits 330-1 to 330-7 and output gates 340-1 to 340-7 have the same circuit configuration as those shown in FIG. 7.

As shown in FIG. 7, the latch circuit 330-0 includes an SR (set/reset) latch circuit 331 that is set when the input-gate control signal CIT0 is changed from a low level to a high level and is reset when the output-gate control signal COT0 is changed from a high level to a low level. In a set state of the SR latch circuit 331, the logical level "1" is latched, and thereby, a state that the read command MDRDT is retained is established. Resetting of the SR latch circuit 331 is performed by a reset circuit 332. A reset signal RST can be inputted to the reset circuit 332, and when the reset signal RST is activated, the latch circuits 330-0 to 330-7 are all reset forcibly.

Further, the output gate 340-0 outputs the logical level latched to the SR latch circuit 331 in a period during which the output-gate control signal COT0 is at a high level. In a period during which the output-gate control signal COT0 is at a low level, the output is in a high impedance state. Outputs of the output gates 340-0 to 340-7 are supplied to the combining circuit 350.

As shown in FIG. 2, the combining circuit 350 includes: a wired-OR circuit 351 that combines the outputs from the output gates 340-0 to 340-3; a wired-OR circuit 352 that combines the outputs from the output gates 340-4 to 340-7; and an OR gate circuit 353 that combines outputs of the wired-OR circuits 351 and 352. Output of the OR gate circuit 352 is used as an output control signal DRC.

In this way, in the present embodiment, the outputs from the eight latch circuits 330-0 to 330-7 are grouped in two, and each group is wired-OR connected, and the obtained wired-OR outputs are further combined by a logic gate circuit. According to such a configuration, as compared to a case that the outputs from all the latch circuits 330-0 to 330-7 are collected together and wired-OR connected, the output loads of the output gates 340-0 to 340-7 are further reduced. Thus, the signal quality of the output control signal DRC can be increased.

The combining circuit 350 includes reset circuits 354 and 355 that reset the wired-OR circuits 351 and 352, respectively. The reset circuit 354 resets the wired-OR circuit 351 in response to the output-gate control signal COT4, and the reset circuit 355 resets the wired-OR circuit 352 in response to the output-gate control signal COT0. Both the reset circuits 354 and 355 are configured by an N-channel MOS transistor, and gates thereof are supplied with the output-gate control signals COT4 and COT0, respectively. Sources thereof are both connected to a grounding potential (VSS). Accordingly, when the output-gate control signal COT4 is activated, the reset circuit 354 is turned on, and the wired-OR circuit 351 is reset to a low level. Likewise, when the output-gate control signal COT0 is activated, the reset circuit 355 is turned on, and the wired-OR circuit 352 is reset to a low level.

As described above, the output-gate control signals COT0 to COT7 are sequentially activated by the counter circuit 200 in this order. Thus, it is immediately after the activation of the output-gate control signals COT0 to COT3 is ended that the output-gate control signal COT4 is activated, and thus the output control signal DRC is not outputted for a while from the wired-OR circuit 351. When the reset circuit 354 is turned on at such timings, a period until the output-gate control signals COT0 to COT3 are activated next is sufficiently secured. Thus, it becomes possible to surely reset the wired-OR circuit 351. The same applies to the reset circuit 355. To the wired-OR circuits 351 and 352, the latch circuits 351a and 352a are connected, respectively. Thereby, the logical level of a period during which all the corresponding output gates (340-0 to 340-3 or 340-4 to 340-7) become a high impedance state is retained.

As shown in FIG. 2, the latency counter 55 further includes a mode switching circuit 400.

The mode switching circuit 400 includes: a delay circuit 401 that delays the read command MDRDT; and a multiplexer 402 that selects one of the read command MDRDT that is not delayed and the read command MDRDT that is delayed, based on a mode signal.

The multiplexer 402 selects the read command MDRDT that is not delayed in a case of an operation mode (a DLL-on mode) in which the DLL circuit 23 is used. Thereby, to the point-shift FIFO circuit 300, the read command MDRDT is supplied at high speed. On the other hand, in an operation mode (a DLL-off mode) in which the DLL circuit 23 is not used, the multiplexer 402 selects the read command MDRDT that is delayed by the delay circuit 401. As a result, the read command MDRDT is to be supplied to the point-shift FIFO circuit 300 more belatedly than the DLL-on-mode time.

The delay amount of the delay circuit 401 is preferably set to an amount equivalent to the delay of the output clock LCLK caused for the external clock signal CK when the DLL circuit 23 is not operated. According thereto, even when the output clock LCLK is delayed more than the clock signal CK by the DLL-off mode, the same operation margin as that at the time of the DLL-on mode can be secured.

The configuration of the latency counter 55 is as described above. The operation of the latency counter 55 is described next.

Figure 8:
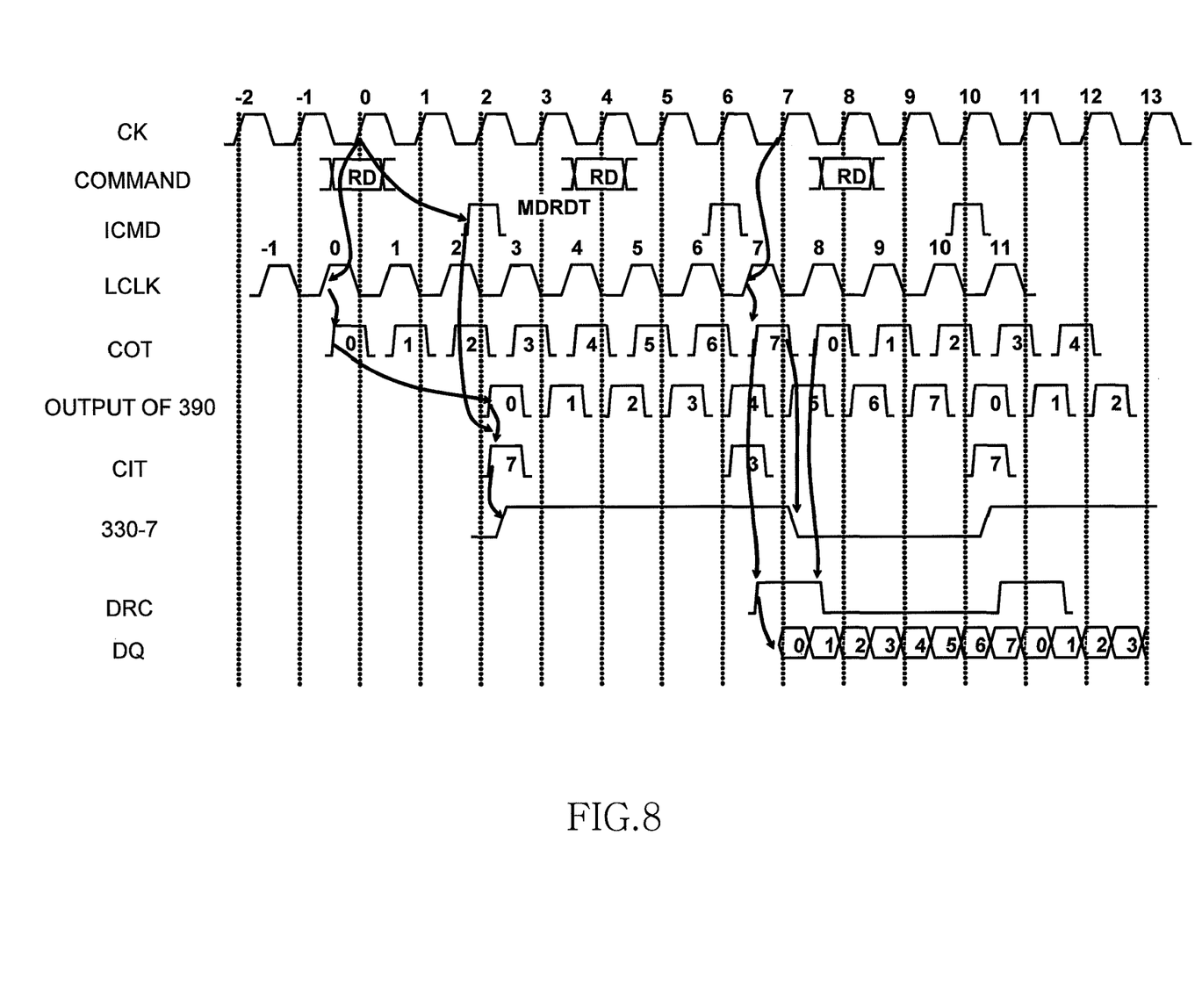
FIG. 8 is a timing chart for explaining an operation of a latency counter 55, and shows an operation at the time of a DLL-on mode.

FIG. 8 is a timing chart for explaining the operation of the latency counter 55, and shows an operation (latency=7) at the time of the DLL-on mode. As described above, in the DLL-on mode, the read command MDRDT is supplied to the point-shift FIFO circuit 300 at high speed.

FIG. 8 shows an example in which the read command RD is issued in synchronism with an edge 0 of the external clock CK. As shown in FIG. 8, it takes a predetermined time from the read command RD is issued until the internal read command MDRDT is generated. The read command MDRDT is retained in any one of the eight latch circuits 330-0 to 330-7 included in the point-shift FIFO circuit 300, based on the output of the counter circuit 200. The example shows a state that the AND gate 310-7 is selected by the output of the delay circuit 390 at the timing at which the read command MDRDT is generated. Accordingly, out of the input-gate control signals CIT0 to CIT7, only the input-gate control signal CIT7 is activated, and the read command MDRDT is to be stored in the latch circuit 330-7.

The read command MDRDT stored in the latch circuit 330-7 is retained in the latch circuit 330-7 until the output-gate control signal COT7 is selected by the increment of the counter circuit 200. When the output-gate control signal COT7 is selected, and the output gate 340-7 is opened, and thus, the output control signal DRC is activated. The output control signal DRC is in synchronism with the output clock LCLK, and by using this, the read data DQ is actually outputted.

Thereafter, upon entering the self-refresh mode or the power-down mode, the DLL circuit 23 shown in FIG. 1 is stopped. Upon returning to the normal operation, hazard sometimes occurs in the output clock LCLK, and as a result, the count values of the counter circuit 200 are sometimes made to jump.

However, in the latency counter 55, the count values themselves are irrelevant, and when correct increment (or decrement) is performed at the time of the normal operation, there is no problem at all. That is, in the first place, there is no case that the count value results in an error, and even when the count values are changed by hazard, a subsequent operation can be directly executed. Thus, according to the latency counter 55, it becomes possible to prevent an error resulting from hazard of the output clock LCLK.

Figure 9:
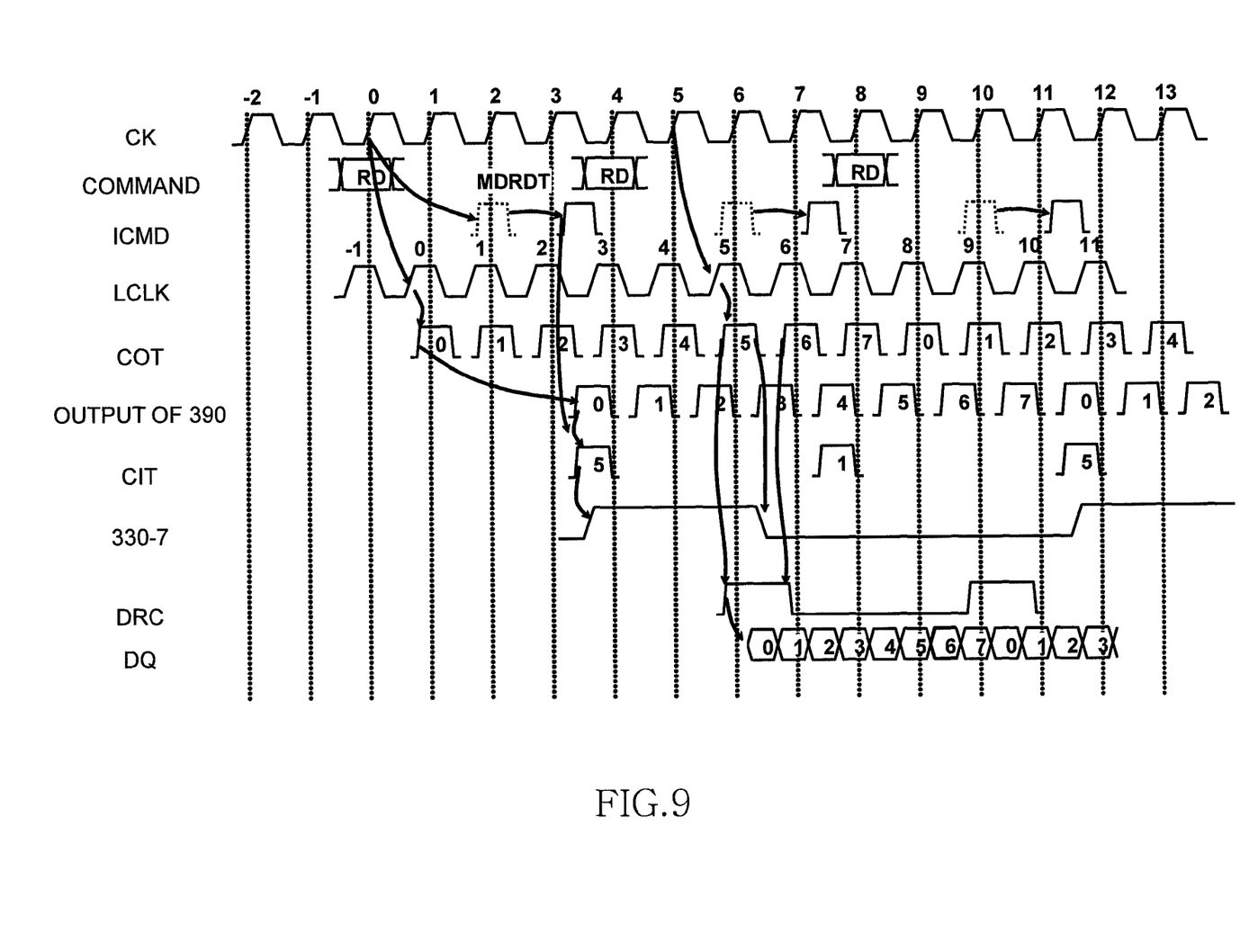
FIG. 9 is a timing chart for explaining an operation of the latency counter 55, and shows an operation at the time of a DLL-off mode.

FIG. 9 is a timing chart for explaining the operation of the latency counter 55, and shows an operation (latency=6) at the time of the DLL-off mode. As described above, during the DLL-off mode, the read command MDRDT is delayed, and then, supplied to the point-shift FIFO circuit 300.

As shown in FIG. 9, during the DLL-off mode, the output clock LCLK is not phase-controlled for the external clock signal CK, and thus there occurs predetermined delay for the clock signal CK. Such delay is offset by delaying supplying of the read command MDRDT by the delay circuit 401. Thereby, it becomes possible to secure the same operation margin as that at the time of the DLL-on mode.

As described above, according to the latency counter 55, the counting operation is performed in synchronism with the frequency dividing clocks LCLKE and LCLKO obtained by frequency-dividing the output clock LCLK by two. Thus, even when the frequency of the output clock LCLK is high, the operation margin of the counter circuit 200 can be sufficiently secured.

The counter circuit 200 is separated in the first counter 210 and the second counter 220, and thus the number of bits of the ripple counter included in the first counter 210 is small. Thereby, the delay occurring in the ripple counter becomes small, and as a result, it becomes possible to directly supply the frequency dividing clocks LCLKE and LCLKO to the selection circuit 230. That is, when the delay of the ripple counter is large, to synchronize accurately, it is necessary to delay the frequency dividing clocks LCLKE and LCLKO by a certain extent, and then, input the same to the selection circuit 230. In this case, there occurs a need of re-synchronizing the read command MDRDT to the output clock LCLK by arranging a re-synchronizing circuit that restores the delay. Such a re-synchronizing circuit can be a factor of deteriorating a transfer margin of a command when the frequency of the clock is high. However, in the present embodiment, such a re-synchronizing circuit is unnecessary, and as a result, even when the frequency of the clock is high, a sufficient transfer margin can be secured.

Further, the first counter 210 counts the frequency dividing clock LCLKE in a binary format while the second counter 220 fetches the count values of the first counter 210 in synchronism with the frequency dividing clock LCLKO. Thus, the count values of the first counter 210 and those of the second counter 220 are not deviated. Thus, the read command MDRDT latched based on the count values of the first counter 210 can be outputted based on the count values of the second counter 220. Needless to say, this operation can be executed vice versa. This means that although the counting operation is performed in synchronism with the frequency dividing clocks LCLKE and LCLKO, the point-shift FIFO circuit 300 is not affected by the frequency-division.

That is, when the count values of the first counter 210 and those of the second counter 220 are unrelated, it becomes essential to output the read command MDRDT latched based on the count values of the first counter 210 based on the count values of the first counter 210. Likewise, it becomes essential to output the read command MDRDT latched based on the count values of the second counter 220 based on the count values of the second counter 220. In this case, the number of latencies settable to the point-shift FIFO circuit 300 includes only an even number, and thus, in order that the latencies are set to odd numbers, it becomes necessary to add a latency adding circuit or the like. However, in the present embodiment, the count values of the first counter 210 and those of the second counter 220 are interlocked, and thus such a restraint can be eliminated. As a result, it becomes possible to set the number of latencies to an arbitrary value without adding a latency adding circuit or the like.

Moreover, in the present embodiment, because the first counter 210 is a ripple counter, as described above, it is possible to prevent an error resulting from hazard of the output clock LCLK.

In the present embodiment, the input selection circuit 310 is arranged at a preceding stage of the shift circuit 320, and only when the read command MDRDT is supplied, the shift circuit 320 is operated. Thus, as compared to a case that the shift circuit is operated all the time irrespective of the presence of the read command MDRDT, the power consumption can be further reduced.

In the present embodiment, the outputs of the output gates 340-0 to 340-7 are grouped in two, and each group is wired-OR connected. Further, the obtained wired-OR outputs are combined by the logic gate circuit. As a result, as compared to a case that all the outputs are collected together and wired-OR connected, the output loads are further reduced. Thereby, the signal quality of the output control signal DRC can be increased.

In the present embodiment, by using the mode switching circuit 400, when the DLL-off mode is selected, the read command MDRDT is supplied more belatedly than the DLL-on-mode time. As a result, even when the output clock LCLk is more belated than the external clock signal CK, the fetching margin of the read command MDRDT can be sufficiently secured similarly to a case that the DLL-on mode is selected.

Figure 10:
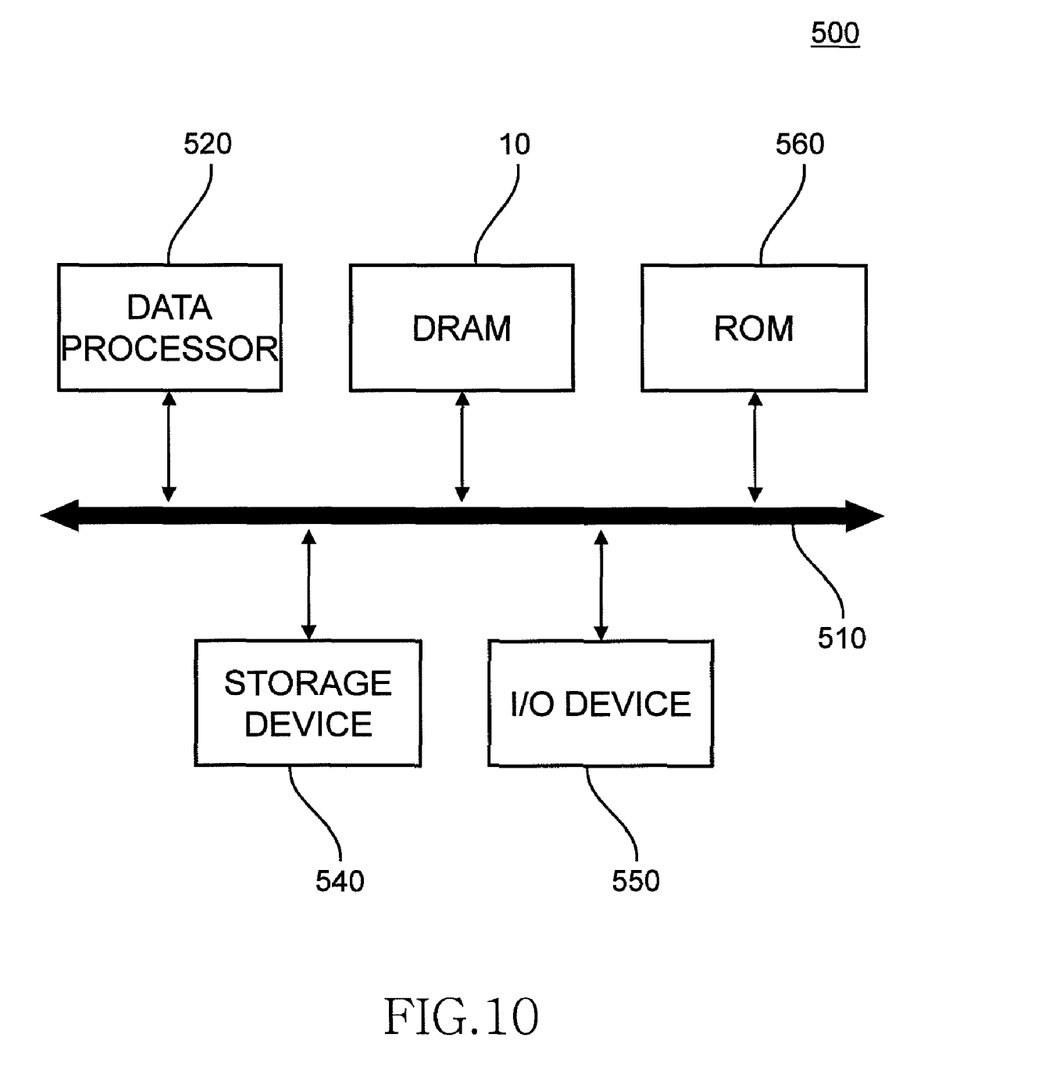
FIG. 10 is a block diagram showing a configuration of a data processing system 500.

FIG. 10 is a block diagram showing the configuration of a data processing system 500 using the semiconductor memory device 10.

The data processing system 500 shown in the FIG. 10 has a configuration such that a data processor 520 and the semiconductor memory device (DRAM) 10 are mutually connected via a system bus 510. Examples of the data processor 520 include, but are not limited to a microprocessor (MPU), a digital signal processor (DSP) or the like. In FIG. 10, for the sake of simplicity, the data processor 520 and the DRAM 530 are connected via the system bus 510. However, these elements can be connected by a local bus, rather than being connected via the system bus 510.

In FIG. 10, for the sake of simplicity, only one set of system bus 510 is shown. However, according to need, the system buses 510 can be arranged via a connector or the like, in series or in parallel. In a memory-system data processing system shown in FIG. 10, a storage device 540, an I/O device 550, and a ROM 560 are connected to the system bus 510. However, these constituent elements are not necessarily essential.

Examples of the storage device 540 can include a hard disk drive, an optical disk drive, and a flash memory. Examples of the I/O device 550 can include a display device such as a liquid crystal display, and an input device such as a keyboard and a mouse. The I/O device 550 can function either as an input device or as an output device. For the sake of simplicity, each constituent element shown in FIG. 10 is illustrated one each. However, the number is not limited to one. That is, two or more constituent elements can be arranged.

It is apparent that the present invention is not limited to the above embodiments, but may be modified and changed without departing from the scope and spirit of the invention.

For example, in the present embodiment, the frequency dividing circuit 100 is used to frequency-divide the output clock LCLK by two. However, the frequency dividing number is not limited thereto in the present invention. Accordingly, when the output clock LCLK is higher-speed, the output clock LCLK can be frequency-divided by four, and also, similarly to the second counter 220, the third and fourth counters interlocked with the first counter 210 can be used.

In the present embodiment, while the first counter 210 includes the ripple counter, the present invention is not limited thereto.

In the present embodiment, while the counter circuit 200 is used as a part of the latency counter 55, utilization of the counter circuit according to the present invention is not limited thereto.

Further, in the present invention, the configuration of the point-shift FIFO circuit 300 is arbitrary, and not limited to the configuration described above. In addition, in the present invention, it is not essential to provide the mode switching circuit 400.

In the present embodiment, the outputs of the output gates 340-0 to 340-7 are received by the wired-OR circuits 351 and 352 divided into two. However, the number of the wired-OR circuits to be divided is not limited thereto, and they can be divided into three or more, and they do not necessarily need to be divided.

In the present embodiment, the wired-OR circuit 351 is reset in response to the output-gate control signal COT4, and the wired-OR circuit 352 is reset in response to the output-gate control signal COT0. However, the timing at which the wired-OR circuits 351 and 352 are reset is not limited thereto. Accordingly, it suffices that the wired-OR circuit 351 is reset in response to the count values of the counter circuit 200 indicating a latch circuit corresponding to the wired-OR circuit 352. Likewise, it suffices that the wired-OR circuit 352 is reset in response to the count values of the counter circuit 200 indicating a latch circuit corresponding to the wired-OR circuit 351.

What is claimed is:
1. A counter circuit comprising:
   a frequency dividing circuit that generates a plurality of frequency dividing clocks based on a clock signal, the frequency dividing clocks including at least first and second frequency dividing clocks, which differ in phase to each other;
a first counter that counts the first frequency dividing clock;
a second counter that fetches a count value of the first counter in synchronism with the second frequency dividing clock; and
a selection circuit that exclusively selects count values of the first and second counters.

2. The counter circuit as claimed in claim 1, wherein the selection circuit selects a count value of the first counter based on the first frequency dividing clock, and the selection circuit selects a count value of the second counter based on the second frequency dividing clock.

3. The counter circuit as claimed in claim 1, wherein the first counter includes a ripple counter that outputs the count value in a binary format.

4. The counter circuit as claimed in claim 3, wherein the first counter further includes a first delay circuit that matches change timings of a plurality of bits configuring the count value.

5. The counter circuit as claimed in claim 4, wherein the second counter includes a second delay circuit that delays the second frequency dividing clock, and the second counter fetches the count value of the first counter in response to the second frequency dividing clock delayed by the second delay circuit.

6. The counter circuit as claimed in claim 5, wherein a delay amount of the second delay circuit is larger than a delay amount of the first delay circuit.

7. A latency counter that counts a latency of an internal command in synchronism with a clock signal, the latency counter comprising:
a counter circuit; and
a point-shift FIFO circuit including a plurality of latch circuits, wherein
the counter circuit includes:
a frequency dividing circuit that generates a plurality of frequency dividing clocks based on a clock signal, the frequency dividing clocks including at least first and second frequency dividing clocks, which differ in phase to each other;
a first counter that counts the first frequency dividing clock;
a second counter that fetches a count value of the first counter in synchronism with the second frequency dividing clock; and
a selection circuit that exclusively selects count values of the first and second counters,
the point-shift FIFO circuit fetches the internal command to any one of the latch circuits based on a count value of the counter circuit, and outputs the internal command fetched to any one of the latch circuits based on a count value of the counter circuit.

8. The latency counter as claimed in claim 7, wherein the point-shift FIFO circuit includes:
an input selection circuit that supplies the internal command to any one of a plurality of signal paths based on the count value of the counter circuit;
a shift circuit that supplies the internal command to a predetermined latch circuit based on a predetermined relationship between the signal paths and the latch circuits; and
an output selection circuit that outputs the internal command fetched to any one of the latch circuits based on the count value of the counter circuit.

9. The latency counter as claimed in claim 8, wherein each of the latch circuits includes an SR (set/reset) latch circuit that is set in response to input of the internal command and that is reset in response to output of the internal command.

10. The latency counter as claimed in claim 8, wherein the shift circuit is capable of changing the relationship between the signal paths and the latch circuits based on a setting signal.

11. The latency counter as claimed in claim 7, wherein the point-shift FIFO circuit includes:
a first wired-OR circuit that logically operates based on outputs of a plurality of latch circuits belonging to a first group among the latch circuits;
a second wired-OR circuit that logically operates based on outputs of a plurality of latch circuits belonging to a second group among the latch circuits;
a gate circuit that logically operates based on outputs of at least the first and second wired-OR circuits; and
first and second reset circuits that reset the first and second wired-OR circuits, respectively, based on the count value of the counter circuit.

12. The latency counter as claimed in claim 11, wherein
the first reset circuit resets the first wired-OR circuit in response to the count value of the counter circuit indicating a predetermined latch circuit different from the latch circuits belonging to the first group, and
the second reset circuit resets the second wired-OR circuit in response to the count value of the counter circuit indicating a predetermined latch circuit different from the latch circuits belonging to the second group.

13. The latency counter as claimed in claim 7, further comprising a mode switching circuit that relatively promptly supplies the internal command to the point-shift FIFO circuit in a first operation mode, and relatively slowly supplies the internal command to the point-shift FIFO circuit in a second operation mode.

14. The latency counter as claimed in claim 13, wherein the first operation mode is a state where the clock signal is phase-controlled, and the second operation mode is a state where the clock signal is not phase-controlled.

15. A semiconductor memory device comprising a latency counter that counts a latency of an internal command in synchronism with a clock signal, the latency counter including a counter circuit and a point-shift FIFO circuit having a plurality of latch circuits, wherein
the counter circuit includes:
a frequency dividing circuit that generates a plurality of frequency dividing clocks based on a clock signal, the frequency dividing clocks including at least first and second frequency dividing clocks, which differ in phase to each other;
a first counter that counts the first frequency dividing clock;
a second counter that fetches a count value of the first counter in synchronism with the second frequency dividing clock; and
a selection circuit that exclusively selects count values of the first and second counters,
the point-shift FIFO circuit fetches the internal command to any one of the latch circuits based on a count value of the counter circuit, and outputs the internal command fetched to any one of the latch circuits based on a count value of the counter circuit.

16. A data processing system comprising a semiconductor memory device and a data processor connected to each other by a system bus, the semiconductor memory device including a latency counter that counts a latency of an internal command in synchronism with a clock signal, the latency counter including a counter circuit and a point-shift FIFO circuit having a plurality of latch circuits, wherein the counter circuit includes:
a frequency dividing circuit that generates a plurality of frequency dividing clocks based on a clock signal, the frequency dividing clocks including at least first and second frequency dividing clocks, which differ in phase to each other;
a first counter that counts the first frequency dividing clock;
a second counter that fetches a count value of the first counter in synchronism with the second frequency dividing clock; and
a selection circuit that exclusively selects count values of the first and second counters,
the point-shift FIFO circuit fetches the internal command to any one of the latch circuits based on a count value of the counter circuit, and outputs the internal command fetched to any one of the latch circuits based on a count value of the counter circuit.

* * * * *